United States Patent [19]

Russell et al.

[11] Patent Number: 5,274,343
[45] Date of Patent: Dec. 28, 1993

[54] PLURAL SWITCH CIRCUITS HAVING RF PROPAGATION NETWORKS AND RF TERMINATIONS

[75] Inventors: Mark E. Russell, Londonderry; John F. Mara, Jr., Nashua, both of N.H.; Edward G. Daly, III, Pepperell, Mass.

[73] Assignee: Raytheon Company, Lexington, Mass.

[21] Appl. No.: 740,691

[22] Filed: Aug. 6, 1991

[51] Int. Cl.⁵ .............................. H01P 1/15
[52] U.S. Cl. .................. 333/103; 333/104; 333/262; 307/571
[58] Field of Search ............. 333/101, 103, 104, 105, 333/124, 126, 129, 262; 307/571

[56] References Cited

U.S. PATENT DOCUMENTS

| | | | |
|---|---|---|---|
| 2,823,358 | 2/1958 | Means et al. | 333/105 |
| 3,694,775 | 9/1972 | Rogers | 333/101 |
| 4,542,300 | 9/1985 | Nagatomi | 333/103 X |
| 4,810,911 | 3/1989 | Noguchi | 307/571 |
| 4,897,563 | 1/1990 | Bahl | 333/103 X |
| 4,939,485 | 7/1990 | Eisenberg | 333/104 |
| 4,994,773 | 2/1991 | Chen et al. | 333/104 X |
| 5,023,494 | 6/1991 | Tsukii et al. | 333/104 X |
| 5,061,911 | 10/1991 | Weidman et al. | 333/104 |

FOREIGN PATENT DOCUMENTS

| | | | |
|---|---|---|---|
| 101122 | 5/1986 | Japan | 333/103 |
| 77403 | 5/1987 | Japan | 333/104 |
| 801062 | 9/1958 | United Kingdom | 333/101 |

OTHER PUBLICATIONS

Minck, John; "Transfer Switches Allow Circuit Paths Alternate Routes"; *Microwaves*; vol. 21, No. 4; Apr. 1982; p. 98.

*Primary Examiner*—Benny Lee
*Attorney, Agent, or Firm*—Donald F. Mofford; Richard M. Sharkansky

[57] ABSTRACT

A radio frequency circuit includes a first RF switch having a first common port coupled to an input port of the switch circuit and a first pair of branch ports and a second RF switch having a second common port coupled to an output port of the circuit and a second pair of branch ports. The radio frequency circuit further includes an RF propagation network having a first end coupled to a first one of said first pair of branch ports of said first RF switch and a second end coupled to a first one of said second pair of branch ports of said second RF switch. The radio frequency circuit further includes an RF termination having an impedance characteristic corresponding to an impedance characteristic of said first common port and having a first end coupled to a second one of said first pair of branch ports of said first RF switch and a second end coupled to a first reference potential.

9 Claims, 5 Drawing Sheets

PLURAL SWITCH CIRCUITS HAVING RF PROPAGATION NETWORKS AND RF TERMINATIONS

This invention was made with Government support under Contract No. DAAH01-87-C-A025 awarded by the Department of the Army. The Government has certain rights in this invention.

BACKGROUND OF THE INVENTION

This invention relates generally to radio frequency circuits and more particularly to radio frequency switch circuits.

As is known in the art, a radio frequency (RF) switch circuit (hereinafter switch or switch circuit) is a device used to connect and disconnect RF signal paths in an electrical circuit. When connecting RF signal paths, a switch generally provides a bi-directional RF signal path. Thus, signals fed to an input port of the switch appear at an output port of the switch and vice-versa.

As is also known in the art, switches may be provided in several configurations including the so-called single pole single-throw (SPST) configuration and the single pole multi-throw (SPMT) configuration.

A single pole single-throw switch includes one input port generally referred to as a common port and one output port generally referred to as a branch port. When the SPST switch provides a signal path having a relatively low insertion loss characteristic between the common port and the branch port, the switch is generally referred to as being in the "on" position. When the switch provides a signal path having a relatively high insertion loss characteristic between the common port and the branch port the switch is generally referred to as being in the "off" position.

A single pole multi-throw switch includes one common port and two or more branch ports. The SPMT switch provides a first signal path having a low insertion loss characteristic between the common port and a selected one of the branch ports. The SPMT switch also provides signal paths having a relatively high insertion loss characteristic between the common port and the unselected branch ports.

Both the SPST and SPMT switches may be provided either in the so-called reflective or non-reflective configurations. When in the off position, a reflective switch reflects signals fed thereto back to the signal source. On the other hand, a non-reflective switch in the off position provides a matched characteristic impedance to signals fed thereto and thus terminates such signals. In the on state, however, both the reflective and non-reflective switch types provide a signal path having a relatively low insertion loss characteristic between the common port and a selected branch port.

The electrical characteristics of an RF switch include isolation, insertion loss, switching speed and RF power handling capability. Depending upon the particular application it is often necessary to optimize one of these electrical characteristics by trading off the performance of the other electrical characteristics of the switch.

In one type of application, RF switch circuits are often used to select between an RF signal source and one of several signal paths or conversely between one of several RF signal sources and a common signal path. For example, radar systems capable of operating at several independent frequencies often include multiple, typically two or three, signal sources. To maintain the frequency stability of such signal sources it is necessary to allow each of the multiple signal sources to continuously provide a signal.

Radar systems, however, generally include a single transmit signal path between the multiple signal sources and a transmit antenna. A switch circuit is used to provide RF connections between each of the signal sources and the transmit signal path of the radar system. Since typical radar systems can, at any instant, only operate at a single frequency it is necessary to provide the radar system transmit path with one signal having a frequency corresponding to that of a selected one of the multiple signal sources. Thus, the switch should provide one RF connection having a low insertion loss characteristic between a selected one of the multiple signal sources and the radar's transmit path. The switch should also provide RF connections having a relatively high insertion loss characteristic between the remaining unselected signal sources and the radar system transmit path.

Since each of the multiple signal sources continuously provide signals, any signals which "leak" between the unselected signal paths of the switch and the selected signal path of the switch will be provided to the transmit path of the radar system. This generally degrades the performance of the radar system. Thus, in this particular application, it is desirable for the switch to provide highly isolated signal paths.

The isolation characteristic of a SPST switch is generally determined by measuring the difference between the power level of a signal provided at the switch output port with the switch on and with the switch off. In the case of a SPMT switch connecting one of several signal sources to a common output signal path, isolation may be defined as the difference in signal power level between the desired signal and undesired signals at the output port of the switch.

RF switches having high isolation characteristics may be provided using PIN diodes. Depending on whether it is desirable to provide a reflective or non-reflective switch, the PIN diodes may be serially coupled along a transmission line or disposed in shunt (i.e. coupled between the transmission line and ground) to provide a switch circuit.

Regardless of whether the PIN diodes are provided in a series or shunt configuration along the transmission line, the desired isolation characteristic of the switch determines the number of diodes required to provide the switch. For example, to provide an isolation characteristic of 80 decibels (dB) typically requires a switch having four PIN diodes with each diode being separated by an electrical path length substantially corresponding to 90 electrical degrees (i.e. a quarter of a wavelength) at the desired frequency of operation.

Several problems exist with the PIN diode approach. First, due to the required diode spacing of 90 electrical degrees, this approach generally provides a relatively large circuit. Second the PIN diode approach generally requires a driver circuit with which to provide bias voltages to switch the PIN diodes. It is often difficult to design and integrate such a driver circuit with the PIN diodes. Third, because of the existence of minority carriers in the intrinsic (I) region of a PIN diode, PIN diode switches are generally limited in their switching speed.

To overcome the size problem and the driver circuit problem of the PIN diode approach, switches have been provided as monolithic integrated circuit field effect transistors (FETs). FET switches typically have a relatively fast switching characteristic however, they have a relatively low isolation characteristic typically of about 50 dB.

Thus, it would be desirable to provide a switch circuit which provides a high isolation characteristic, a relatively fast switching characteristic and which is easily fabricated. It would also be desirable to provide a circuit which provides a signal path between a selected one of multiple signal sources and a common signal path while providing highly isolated signal paths between the unselected signal sources and the common signal path.

SUMMARY OF THE INVENTION

In accordance with the present invention, a circuit includes a first RF switch having a first common port coupled to an input port of the circuit and a first pair of branch ports and a second RF switch having a second common port coupled to an output port of the circuit and a second pair of branch ports. The circuit further includes an RF propagation network having a first end coupled to a first one of the first pair of branch ports of the first RF switch and a second end coupled to a first one of the second pair of branch ports of the second RF switch. The circuit further includes an RF termination having an impedance characteristic corresponding to an impedance characteristic of the first common port and having a first end coupled to a second one of the first pair of branch ports of the first RF switch and a second end coupled to a first reference potential. With such an arrangement an RF switch circuit having a high isolation characteristic between the input and output ports is provided. If the RF propagation network is provided with an electrical pathlength in the range of 60 to 120 electrical degrees at the frequency of signals fed thereto, the circuit provides an isolation characteristic corresponding to the combined isolation characteristics provided by the first and second RF switches. Thus, when the first and second switches are in the on position, a signal path having a relatively low insertion loss characteristic between the input port and the output port of the circuit is provided. However, when the first and second switches are in the off position, the circuit provides a signal path having a relatively high insertion loss characteristic between the input and output ports of the circuit. Furthermore, the RF termination may be provided with an impedance characteristic selected to terminate signals fed thereto with a minimum insertion loss characteristic. Thus, when the first switch provides an RF connection between the input port of the circuit and the RF termination, signals fed to the input port are terminated with a minimum reflection characteristic. Moreover, when the first and second switches are provided as monolithic integrated circuits having integrated driver circuits, the circuit is provided as a compact circuit which is easily fabricated using microwave integrated circuit techniques.

In accordance with a further aspect of the present invention, a circuit includes a first plurality of RF switches with each one of said first plurality of RF switches having a first common port and a first pair of branch ports wherein each of the first common ports provide an input port to the circuit. The circuit further includes a like plurality of RF terminations with each one of the RF terminations having a first end coupled to a corresponding one of the first pair of branch ports and a second end coupled to a first reference potential. The circuit further includes a second, like plurality of RF switches with each switch having a second common port and a second pair of branch ports and a like plurality of RF propagation networks with each of the RF propagation networks having a first end coupled to a first ones of the first plurality of pairs of branch ports and second end coupled to a first ones of the second plurality of pairs of branch ports. The circuit further includes means for providing a signal path between each one of the second plurality of common ports and an output port of the circuit. With such an arrangement, the circuit provides a signal path between each one of the input ports and the output port of the circuit. By appropriately selecting the RF connections provided by the first and second plurality of RF switches, the circuit may provide a selected one of the signal paths having a low insertion loss characteristic between a selected input port and the output port of the circuit. The unselected signal paths, however, provide a high insertion loss characteristic between the unselected input ports and the output port of the circuit. If the electrical pathlengths of the plurality of RF propagation networks are selected to be in the range of 60 to 120 electrical degrees at the desired frequency of operation, the isolation characteristic of the circuit substantially correspond to the combined isolation characteristics provided by the first and second RF switches. If each one of the plurality of input ports of the circuit are coupled to a corresponding one of a like plurality of signal sources, such a circuit may be used to provide, for example, a selectable signal path having a low insertion loss characteristic between a selected one of the plurality of signal sources and the output port of the circuit. The circuit should simultaneously provide a high isolation characteristic between the unselected signal sources and the output port of the circuit. Further, each one of the like plurality of RF terminations may be provided having an impedance characteristic corresponding to a matched impedance characteristic of a corresponding one of the plurality of signal sources. Thus, when a selected ones of the first plurality of RF switches provide an RF connection between the input port of the circuit and the corresponding RF terminations, signals fed to such input ports are terminated with a minimum reflection characteristic.

BRIEF DESCRIPTION OF THE DRAWINGS

The foregoing features of the invention as well as the invention itself may be more fully understood from the following detailed description of the drawings, in which.

DESCRIPTION OF THE PREFERRED EMBODIMENT

Figure 1:
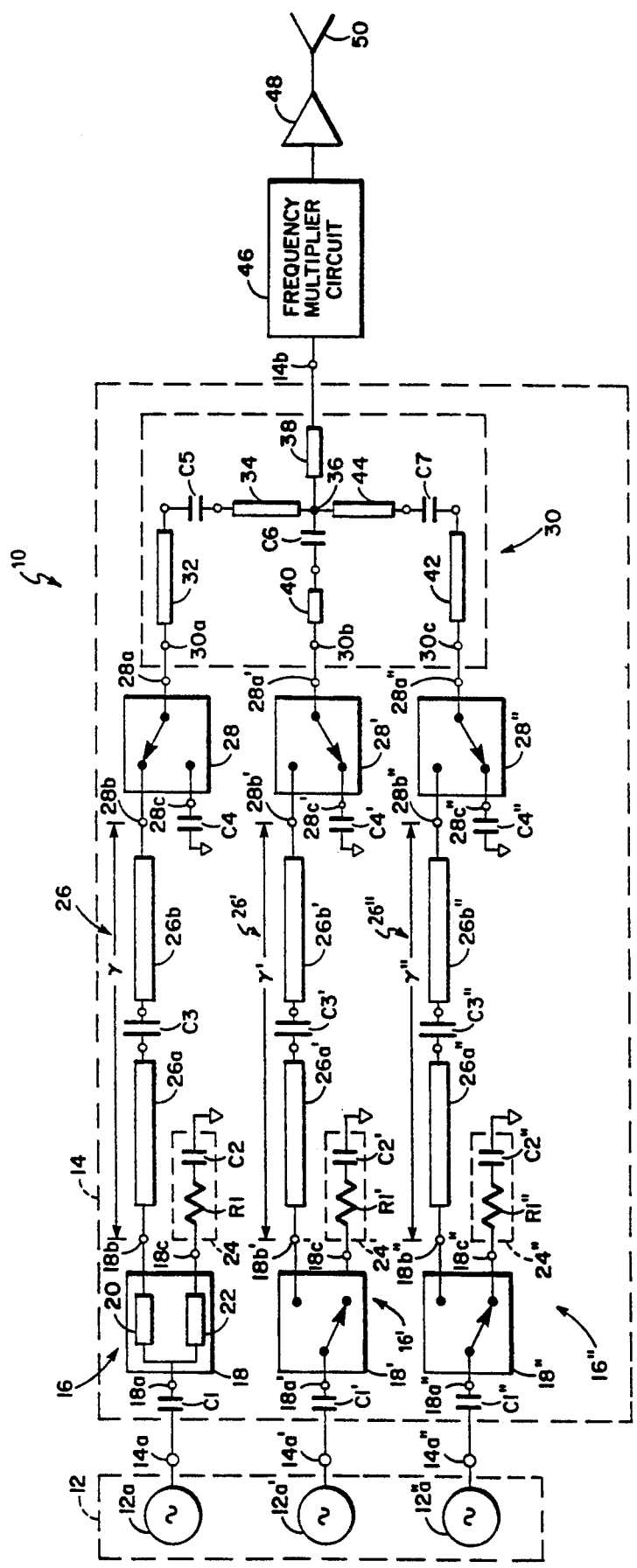
FIG. 1 is a block diagram of a radar system transmit path including a detailed schematic diagram of a three channel switch circuit coupling one of three signal sources to a common signal path.

Referring now to FIG. 1, a radar system transmit path 10 includes an oscillator circuit 12 having three oscillators 12a, 12a' and 12a" which may be provided for example as SAW oscillators or crystal oscillators. Each one of the oscillators provides a radio frequency (RF) signal having a different pre-determined frequency.

The oscillators 12a, 12a', 12a" are coupled to a switch 14 at input ports 14a, 14a' and 14a", respectively. The switch 14 provides substantially identical signal paths 16, 16' 16" between input ports 14a, 14a' and 14a" and a common output port 14b.

The RF signal path 16, illustrative also of RF signal paths 16' and 16", includes a first single pole double throw (SPDT) RF switch 18 having a common port 18a and a pair of branch ports 18b, 18c. An optional DC blocking capacitor C1 is serially coupled between the input port 14a and the common port 18a. The switch 18 includes a pair of signal paths 20 and 22. The signal path 20, illustrative also of signal path 22, is coupled between the common port 18a and the branch port 18b.

Figure 1A:
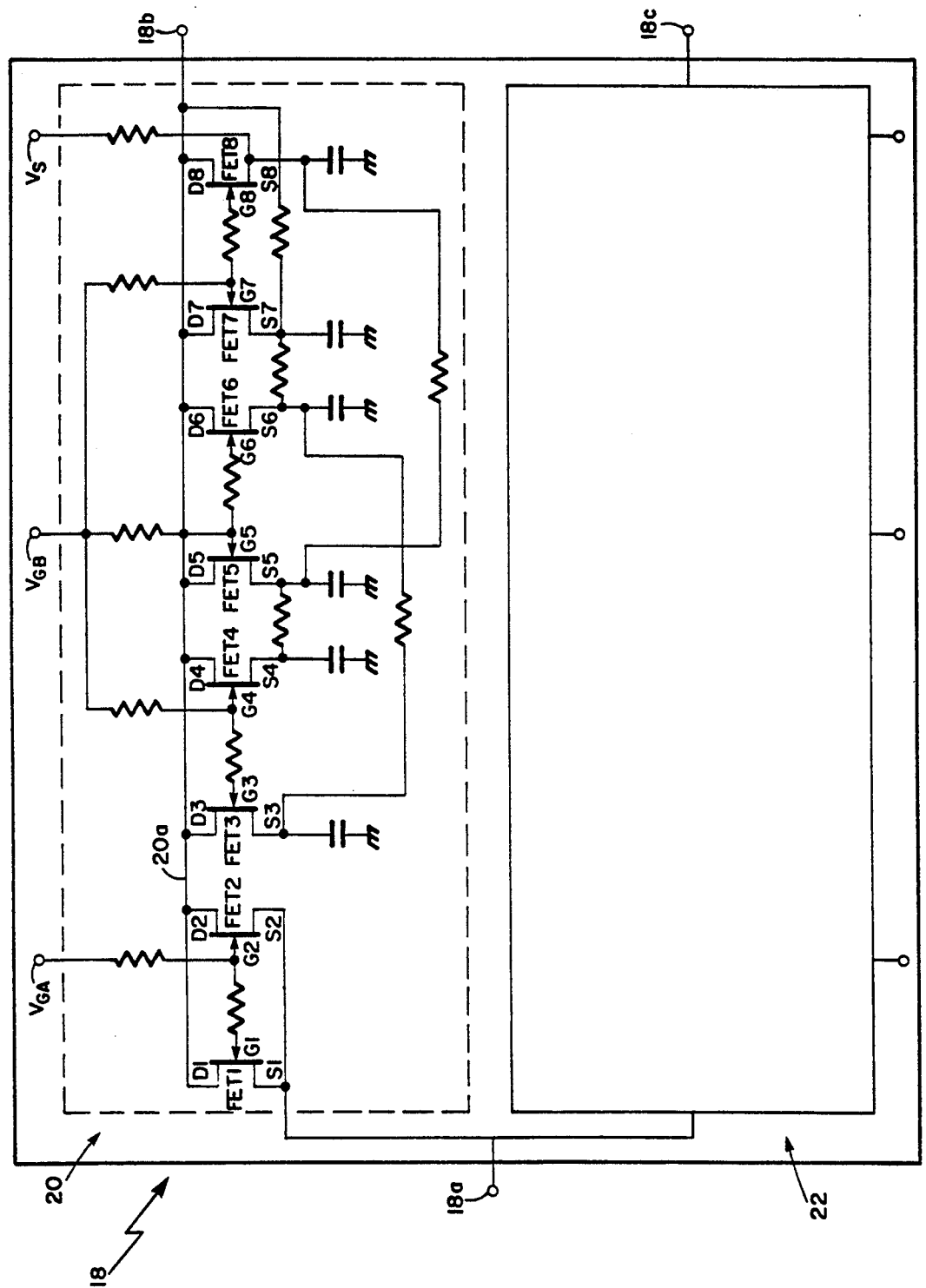
FIG. 1A is a schematic diagram of a single pole double throw switch of the type used in the three channel switch circuit of FIG. 1.

Referring momentarily to FIG. 1A, the signal path 20 of the switch 18 includes a plurality of field effect transistors (FETs) FET1, FET2, FET3, FET4, FET5, FET6, FET7 and FET8, with each transistor having gate, source and drain electrodes, are coupled to a transmission line 20a. The transistors, FET1, FET2 are disposed having source electrodes S1, S2 coupled to the common port 18a and the drain electrodes D1, D2 coupled to the transmission line 20a. The gate electrodes G1, G2 are coupled to a first reference potential $V_{GA}$.

The transistor FET3, FET4, FET5, FET6, FET7 and FET8 are disposed with drain electrodes D3, D4, D5, D6, D7 and D8 coupled to the transmission line 20a and the source electrodes S3, S4, S5, S6, S7 and S8 capacitively coupled, via capacitor (not numbered) to a second reference potential here said reference potential being ground. The gate electrodes G3, G4, G5, G6, G7 and G8 are coupled to a third reference potential $V_{GB}$. Furthermore a voltage signal $V_s$ is provided as shown and with the resistors (not numbered), with appropriate voltage signals are fed to bias the field effect transistors FET1 - FET8 as needed. The FETs may, of course, be disposed in other embodiments well known to those of skill in the art to provide the signal paths 20 and 22.

To provide the signal path 20, for example, with a relatively low insertion loss characteristic a first voltage potential $V_{GA}$ is provided to the gate electrodes G1, G2 to place the transistors FET1 and FET2 in a conductive state. A second voltage potential $V_{GB}$ is provided to the gate electrodes G3 - G8 to place the transistors FET3 - FET8 in a non-conductive state. Thus a signal path having a minimum insertion loss characteristic to RF signals fed thereto is provided between the common port 18a and the branch port 18b. In a similar manner, the signal path 22 of switch 18 will have a minimum insertion loss characteristic to RF signals fed thereto between the common port 18a and the branch port 18c when the transistors (not shown) of signal path 22 are biased as just described.

To provide the signal path 20, for example, with a relatively high insertion loss characteristic a voltage potential $V_{GA}$ is provided to the gate electrodes G1, G2 to place the transistors FET1, FET2 in a non-conductive state. A second voltage potential $V_{GB}$ is provided to the gate electrodes G3 - G8 to place the transistors FET3 - FET8 in a conductive state. In their conductive states, the transistors FET3 - FET8 provide a low RF impedance path to ground. Consequently, the signal path 20 provides a maximum impedance mismatch and thus a maximum insertion loss characteristic between the common port 18a and the branch port 18b. In a similar manner, the signal path 22 of switch 18 will have a maximum insertion loss characteristic to RF signals fed thereto between the common port 18a and the branch port 18c when the transistors (not shown) of signal path 22 are biased as just described. In general, the switch provides a first one of the signal paths 20, 22 with a low insertion loss characteristic and the other signal path with a high insertion loss characteristic.

It should be noted that the switch 18, and similarly the switches 18', 18", 28, 28' and 28", (FIG. 1) may be provided as an integrated circuit having a plurality of transistors arranged using any technique known to those of skill in the art to provide a SPDT switch having an isolation characteristic.

Referring again to FIG. 1 the branch port 18b is coupled to an RF propagation network 26. The branch port 18c is coupled to the first end of an RF termination 24. A second end of the RF termination is coupled to a reference potential (here ground). The RF termination 24 is here provided from a series resistor R1 having a first electrode coupled to a first end of the RF termination and a second electrode coupled to a first electrode of a capacitor C2. A second electrode of the capacitor C2 is coupled to the second end of the RF termination. Other arrangements may of course be used to provide the RF termination.

In operation, the RF switch 18 may provide an RF connection having a relatively low insertion loss characteristic between the common port 18a and the branch port 18b. When the switch provides the RF connection between the common port 18a and the branch port 18b, a signal fed from the oscillator 12a is coupled from the common port 18a to the branch port 18b. The signal is subsequently fed to the RF propagation network 26.

Alternatively, the switch 18 may provide an RF connection having a relatively low insertion loss characteristic between the common port 18a and the branch port 18c. In this instance, a signal fed from the oscillator 12a is coupled from the common port 18a to the branch port 18c. The signal is subsequently fed to the RF termination 24. The resistor R1 and capacitor C2 are selected to provide a matched impedance characteristic to signals fed thereto and thus terminate such signals with a minimum reflection characteristic.

It is desirable to provide an impedance characteristic which terminates signals fed thereto with a minimum reflection characteristic since reflected signals tend to "leak" onto the other signal paths of the switches 18 and 28 and thus propagate to the output port 14b. Further, a large reflection characteristic provided by the resistor R1 and the capacitor C2 may provide undesirable variations in the frequency and the power level of signals provided from the signal source 12a. Thus the RF termination 24 may be provided having an impedance characteristic selected to correspond to the impedance characteristic of signals fed to the common port 18a to terminate such signals with a minimum reflection characteristic.

The RF propagation network 26 couples the branch port 18b of the RF switch 18 to a branch port 28b of a second SPDT RF switch 28. The RF propagation network 26 is selected to have an electrical pathlength $\gamma$ in the range of 60 to 120 electrical degrees, with 90 degrees being preferred, at the frequency of the signal provided by the signal source 12a. Similarly, the RF propagation networks 26', 26" are provided with electrical pathlengths γ', γ", respectively in the range of 60 to 120 electrical degrees, with 90 degrees being preferred, at the frequency of the signals provided by the signal sources 12a' and 12a" respectively.

The RF propagation network 26 is here provided from a first RF propagation network 26a having a first end coupled to the branch port 18b and a second end capacitively coupled via an optional capacitor C3 to a first end of a second RF propagation network 26b. A second end of the RF propagation network 26b is coupled to the branch port 28b of the switch 28. A second branch port 28c of the switch 28 is coupled to a reference potential, here ground, via an optional capacitor C4. It should be appreciated, the elements of signal paths 16' and 16" of the switch 14 each correspond to the elements of the signal path 16 and operate as described in connection with signal path 16. Thus, in signal path 16', a capacitor C1' is coupled between the input port 14a' and the common port 18a' of the switch 18'. A branch port 18b' of the switch 18' is coupled to an RF propagation network 26' and a branch port 18c' is coupled to a RF termination 24' including resistor R1' and capacitor C2'. The RF propagation network 26' includes a first RF propagation network 26a' and a second RF propagation network 26b' with a capacitor C3' connected in between as shown. The RF propagation network 26' is further coupled to a branch port 28b' of the switch 28'. The branch port 28c' is coupled via capacitor C4' to an RF ground potential. In a similar manner, in signal path 16", a capacitor C1" is coupled between the input port 14a" and the common port 18a" of the switch 18". A branch port 18b" of the switch 18" is coupled to an RF propagation network 26" and a branch port 18c" is coupled to a RF termination 24" including resistor R1" and capacitor C2". The RF propagation network 26" includes a first RF propagation network 26a" and a second RF propagation network 26b" with a capacitor C3" connected in between as shown. The RF propagation network 26" is further coupled to a branch port 28b" of the switch 28". The branch port 28c" is coupled via capacitor C4" to an RF ground potential.

A common port 28a of the switch 28 is couple a network 30 at an input port 30a. The network 30, here a so-called reactive T-type network, provides signal paths between the common ports 28a, 28a', 28a" and the output port 14b of the switch circuit 14.

The network 30 includes a first RF propagation network 32 having a first end coupled to the input port 30a of the network 30. A second end of the RF propagation network 32 is coupled to a first terminal of a capacitor C5. A second terminal of the capacitor C5 is coupled to a first end of an RF propagation network 34. A second end of the RF propagation network 34 is coupled to a node 36 of the network 30.

A first end of an RF propagation network 38 is coupled to the node 36 and a second end of the RF propagation network 38 is coupled to the output terminal 14b of the switch circuit 14. Thus, an RF signal path (not numbered) is provided between the input port 30a of the network 30 and the output port 14b of the switch 14.

The network 30 further includes an input port 30b coupled to the common port 28a' of the switch 28'. An RF propagation network 40 has a first end coupled to the input port 30b and a second end capacitively coupled via capacitor C6 to the node 36. Thus, a signal path is provided between the input port 30b and the output port 14b.

The network 30 further includes an input port 30c coupled to the common port 28a" of the switch 28". An RF propagation network 42 has a first end coupled to the input port 30c and a second end coupled to a first terminal of a capacitor C7. A second terminal of the capacitor C7 is coupled to a first end of an RF propagation network 44. A second end of the RF propagation network 44 is coupled to the node 36. Thus, a signal path is provided between the input port 30c and the output port 14b.

When the common port 28a of the switch 28 is connected to the branch port 28b, a matched impedance characteristic is provided to the port 30a and subsequently to the node 36. Conversely, as shown in the case of the switches 28', 28" when the common ports 28a', 28a" of the respective switches 28', 28" are connected to the branch ports 28c', 28c", respectively, signal paths are provided between the common ports 28a', 28a" and a first electrode of each one of the capacitors C4' and C4" respectively. A second electrode of each one of the capacitors C4', C4" is coupled to ground. Thus, a relatively high reactive impedance mismatch is provided to the ports 30b and 30c and subsequently to the common node 36.

The high impedance mismatch provided to the node 36 from the ports 30b and 30c prevents a signal fed to the port 30a from propagating to the ports 30b and 30c. Thus the signal propagates to the output port 14b. Therefore, when two of the input ports, 30b, and 30c for example, are terminated in a reactive impedance, the network 30 provides a signal path having a relatively low insertion loss characteristic between the common port 28a and the output port 14b. The network 30 however provides a relatively high insertion loss characteristic between the common ports 28a', 28a" and the output port 14b.

Here, the switches 18 and 28 are selected to provide RF connections having relatively low insertion loss characteristics to the RF propagation network 26. Thus, the signal path 16 provides a relatively low insertion loss characteristic between the input port 14a and the output port 14b of the switch 14.

The switch 18' however provides an RF connection between the signal source 12a' and the RF termination 24'. Further the switch 28' provides an RF connection between the capacitor C4' and the common port 28a'. Thus, the signal path 16' provides a relatively high insertion loss characteristic between the input port 14a' and the output port 14b.

Similarly, the RF switches 18" and 28" having the appropriate RF connections should provide the signal path 16" with a high insertion loss characteristic between the input port 14a" and the output port 14b. Further, the signal paths 16, 16' 16" are each highly isolated from each other as will be described in conjunction with FIG. 2.

Thus, a signal coupled from the signal source 12a to the input port 14a is provided to the output port 14b with a minimum insertion loss characteristic. However, signals coupled from the signal sources 12a', 12a" to the input ports 14a' 14a" are highly isolated from the output port 14b.

By providing the appropriate RF connections between the common ports 18a, 18a', 18a" and 28a, 28a' 28a" and respective branch ports 18b, 18c, 18b', 18c', 18b", 18c" and 28b, 28c, 28b', 28c', 28b", 28c" of the switches 18 - 18" and 28 - 28"', a selected one of the signal paths 16, 16' 16" may be provided with a low insertion loss characteristic while the remaining signal paths are provided with a high insertion loss characteristic. Thus, a signal from a selected one of the multiple signal sources 12a, 12a', 12a" may be provided to the output port 14b while signals from the unselected signal sources are highly isolated from the output port 14b.

The output port 14b of the switch 14 is coupled to a multiplier circuit 46. The multiplier 46 receives a signal having a first frequency from a selected one of the signal sources 12a, 12a', 12a". The multiplier circuit 46 provides an output signal having a frequency which is generally an integer multiple of the input signal frequency.

The output signal from the multiplier circuit 46 is fed to an amplifier 48. The amplifier 48 receives signals fed thereto and provides high power output signals which are emitted from the radar system transmit path 10 via an antenna 50 as is generally know.

Figure 2:
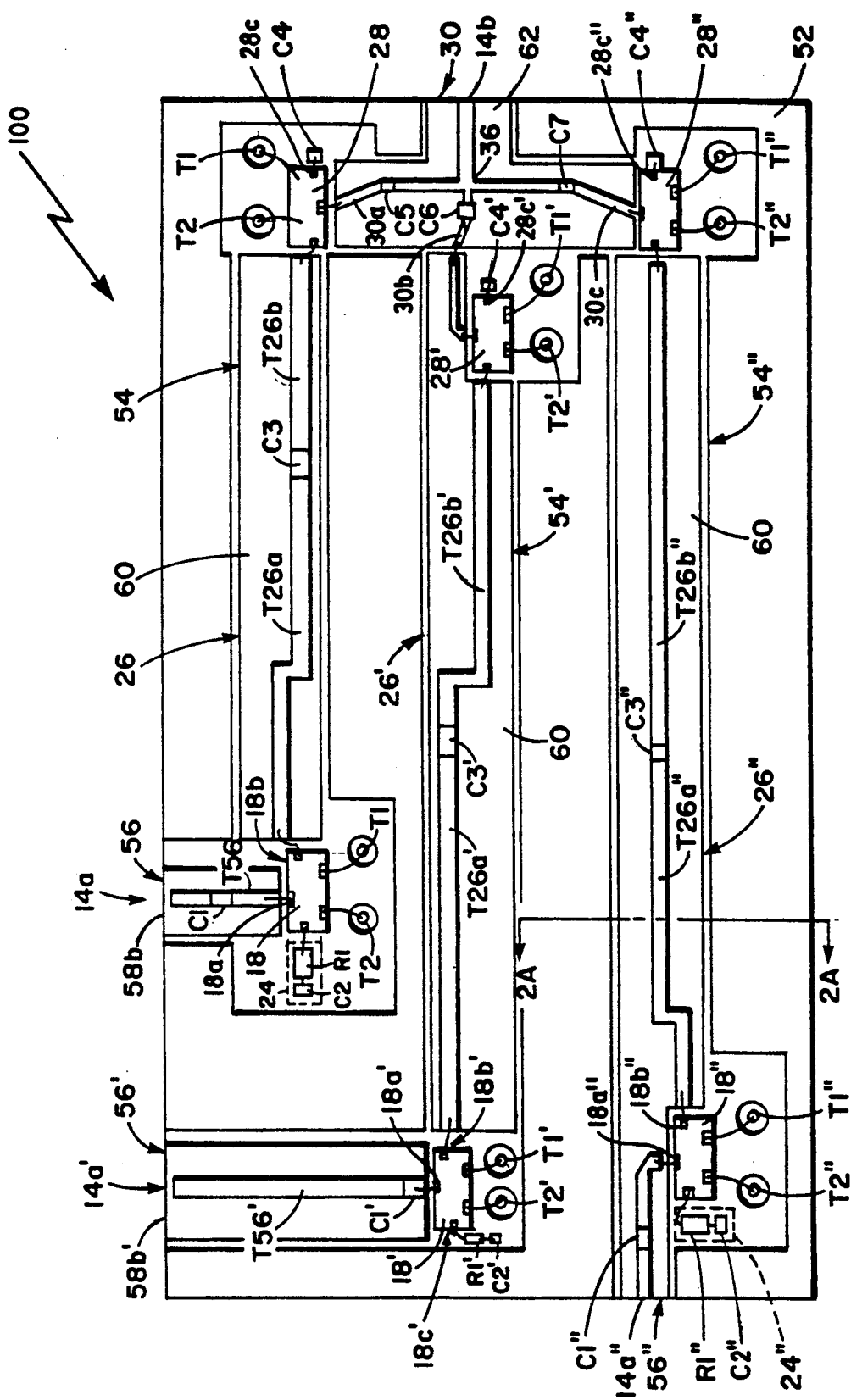
FIG. 2 is a plan view of the three channel switch circuit shown in FIG. 1.
Figure 2A:
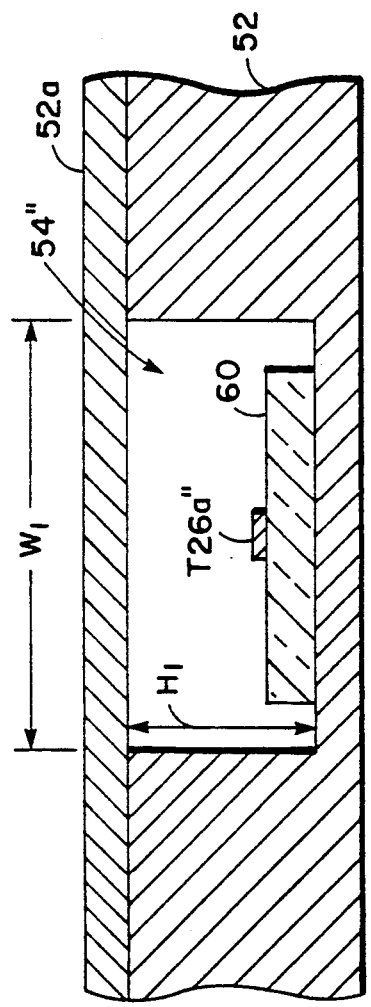
FIG. 2A is a cross-sectional view of a portion of the switch shown in FIG. 2.

Referring now to FIGS. 2 and 2A, the switch circuit 14 of FIG. 1 is here provided as a hybrid microwave integrated circuit (MIC) 100. Like elements of the switch circuit 14 of FIG. 1 are referenced with the same designations in FIG. 2.

The RF switches 18, 18', 18" and 28, 28', 28" are here provided as SPDT MMIC FET switches which may be, for example, of the type manufactured by Texas Instruments, as part number T6S8630 with each switch having a pair of terminals T1, T2, terminals T1', T2' and terminals T1", T2", respectively, as shown. Other FET switches may of course be used. A DC bias voltage provided to the terminal T1 and control signals having TTL voltage levels are fed to the terminal T2. The control signals are used to select which branch ports are connected to the common port of the switch. The common port and branch ports of these particular switches should be provided with so-called DC decoupling capacitors which are here provided as capacitors C1, C2, C3 and C4, C1', C2', C3' and C4' and C1", C2", C3" and C4" having a capacitance typically of about 100 picofarads (pf); capacitors C5, C7 having a capacitance typically of about 7.5 pf and capacitor C6 having a capacitance typically of about 15 pf, as shown. Furthermore, resistors R1, R1' and R1" are disposed, as shown.

The switches 18 - 18" and 28 - 28" are mounted in an aluminum base 52 having portions thereof removed to accept the switches 18 -18" and 28 -28".

Optional input RF propagation networks 56, 56', 56", here provided as microstrip transmission lines, are disposed between the input ports 14a, 14a', 14a" and the switch common ports 18a, 18a' 18a", respectively. The microstrip transmission lines 56, 56' are provided from strip conductors T56, T56', respectively disposed on a first surface (not numbered) of like respective substrates 58b, 58b'. The substrates 58b, 58b' are provided from a Teflon based material such as that manufactured by Rogers Corporation and identified as Rogers RT/Duroid 6006 having a relative dielectric constant of 6.0. A ground plane (not shown) is disposed on a second surface (not numbered) of the substrates 58b, 58b'. The dielectric constant and thickness of the substrates 58b, 58b, are selected to provide the strip conductors T56, T56' with a line width having a characteristic impedance of 50 ohms.

The RF propagation networks 26, 26', 26" are also provided as microstrip transmission lines. The electrical pathlengths of the RF propagation networks 26, 26', 26" should be in the range of 60 to 120 electrical degrees with 90° being preferred. It is generally desirable to keep the physical length of the RF propagation networks 26, 26', 26" short to provide the circuit 14 as a compact assembly.

Thus, strip conductors T26a, T26a' and T26a" and T26b, T26b' and T26b" are each disposed on a first surface (not numbered) of a substrate generally denoted 60 having a relatively high dielectric constant. The substrate 60 may be, for example, a ceramic loaded Teflon provided by Roger Corporation as part number RT/Duroid 6010 and having a dielectric constant typically of about 10.0. For mechanical convenience, the input propagation network 56" is provided on the same substrate as the RF propagation network 26".

The network 30 is provided from a plurality of strip conductors (not numbered) disposed on a first surface of a substrate 62 to provide a plurality of microstrip transmission lines. A ground plane (not shown) is disposed on a second surface of the substrate 62. Here the substrate 62 is provided having a relative dielectric constant of 2.2, and may be of the type manufactured by Rogers Corporation and identified as RT/Duroid 5880, for example.

The relatively low dielectric constant of the substrate 62 provides the network 30 with electrically short signal paths between the input ports 30a, 30b, 30c, and the output port 14b. Thus, the network 30 provides a relatively low insertion loss characteristic to signals fed thereto. When the switches 28-28" provide RF connections between the ports 28a, 28a', and 28a" and capacitors C4, C4', and C4" a high impedance mismatch is provided to the node 36.

The base 52 is provided with a plurality of channels 54, 54' and 54" in which to place RF propagation networks 56 - 56", 26 -26" and the network 30.

Referring momentarily to FIG. 2A, a conductive cover 52a provided over the channels, typified here by channel 54" in the base 52 prevents radiation of electromagnetic energy provided from discontinuities such as bends and junctions in the microstrip transmission lines. Such bends and junctions are often necessary to provide a compact circuit. The height H1 and width W1 of the channels are selected to prevent a resonant mode of any electromagnetic signal from propagating in the channel. Thus, the conductive, cover 52a in conjunction with the channels 54 - 54' and 54" prevents signals from propagating between the signal paths 16, 16' 16" and therefore improves the isolation between the signal paths 16, 16' 16".

Referring again to FIG. 2 it should be appreciated that each of the above mentioned substrates 58b, 58b', and 62, are so-called soft substrates. Conventional MIC circuits typically include microstrip transmission lines provided on a so-called hard substrate, such as Alumina for example. The alumina substrate and the aluminum base have different thermal coefficients of expansion. Thus, as temperatures vary, the alumina substrate and the aluminum base expand and contract at different rates and by different amounts.

Consequently if the alumina substrate is secured directly to the aluminum base, the strength of the connection between the alumina substrate and the aluminum base is compromised due to the different rates of expansion and contraction. To overcome this problem in the conventional approach, the hard substrate is bonded to a conductive member generally referred to as a carrier. The carrier should be provided from a conductive material such as Kovar for example having a thermal coefficient of expansion which is between that of the alumina and the aluminum. A first surface of the carrier is bonded to a first surface of the alumina substrate. A second surface of the carrier is bonded to a first surface of the aluminum base. The differences between the thermal expansion properties of the aluminum base and the alumina substrate are thus accommodated by the carrier.

In the present invention, the so-called soft substrates provide a larger degree of physical flexibility than the hard substrates of the prior art. Because of the physical flexibility of the soft substrates, the strength of the connections between the substrates and the aluminum base 52 are not compromised because of the different rates of expansion and contraction between the aluminum and the substrate materials. Thus, in the present invention the assembly process is less complex since the soft substrates may be secured directly to the aluminum base by applying a conductive epoxy between the ground planes of the soft substrates and the aluminum base.

Figure 3:
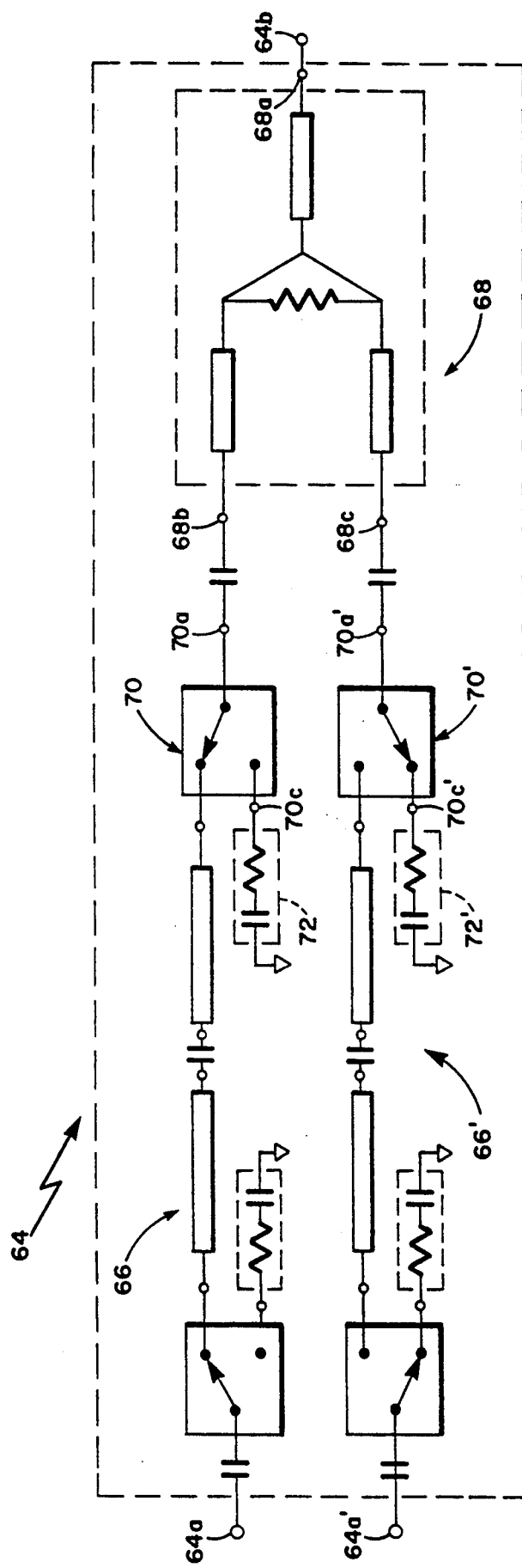
FIG. 3 is a detailed schematic diagram of a two channel switch circuit.

Referring now to FIG. 3, a switch circuit 64 having a pair of signal ports 64a, 64a' and an output port 64b includes a pair of substantially identical signal paths 66, 66'. The signal paths 66, 66' are substantially the same as the signal paths 16, 16' and 16'' (FIG. 1) of the switch circuit 14 (FIG. 1). In switch circuit 64, however, a Wilkenson power divider 68 provides a pair of signal paths between a pair of common ports 70a, 70a' and the output port 64b of the switch circuit 64. To provide a signal path having a relatively low insertion loss characteristic, each port 68a, 68b, 68c of the Wilkenson power divider 68 should be terminated in a matched impedance characteristic as is generally known. Thus each one of the branch ports 70c, of the respective switch 70, 70c' is coupled to a respective RF termination 72, 72' having an impedance characteristic selected to provide a matched impedance characteristic to the Wilkenson power divider.

Having described preferred embodiments of the invention, it will now become apparent to one of skill in the art that other embodiments incorporating their concepts may be used. It is felt, therefore, that these embodiments should not be limited to the disclosed embodiments, but rather should be limited only by the spirit and scope of the appended claims.

What is claimed is:

1. A circuit comprising:
    a first RF switch having a first common port with an impedance characteristic associated therewith and a first pair of branch ports;
    a second RF switch having a second common port and a second pair of branch ports;
    an RF propagation network having a first end coupled to a first one of said first pair of branch ports of said first RF switch and a second end coupled to a first one of said second pair of branch ports of said second RF switch;
    an RF termination having an impedance characteristic corresponding to the impedance characteristic of said first common port and having a first end coupled to a second one of said first pair of branch ports of said first RF switch and a second end coupled to a first reference potential; and wherein the first RF switch and the second RF switch each comprises:
    a first signal path coupled between the common port and the first branch port; and
    a second signal path coupled between the common port and the second branch port; and
    wherein the first signal path and the second signal path each comprises:
    a first and a second field effect transistor, each field effect transistor having a conductive state and a non-conductive state to provide a relatively low insertion loss characteristic when in the conductive state and a relatively high insertion loss characteristic when in the non-conductive state, each field effect transistor having a first electrode coupled to the common port of the RF switch and each field effect transistor having a second electrode coupled to the corresponding branch port of the RF switch; and
    wherein the RF termination comprises:
    a resistor having a first electrode and a second electrode with the first electrode coupled to the first end of said RF termination; and
    a capacitor having a first electrode coupled to the second electrode of said resistor and a second electrode coupled to the first reference potential.

2. The circuit of claim 1 wherein said RF propagation network, having a signal fed thereto, has an electrical pathlength in the range of 60 to 120 electrical degrees to the signal having a pre-determined frequency.

3. The circuit of claim 1 further comprising:
    a different plurality of field effect transistors, each different field effect transistor have a conductive state and a non-conductive state to provide a relatively low insertion loss characteristic when in the conductive state and a relatively high insertion loss characteristic when in the non-conductive state, each one of the different plurality of field effect transistors having a first electrode coupled to a corresponding signal path and further having a second electrode coupled to an RF ground potential.

4. A circuit comprising:
    a first plurality of RF switches, each one of said first plurality of RF switches having a first common port and a first pair of branch ports wherein each one of said first common ports provides an input port of the circuit;
    a plurality of RF terminations, each one of said RF terminations having a first end coupled to one of said first pair of corresponding branch ports;
    a second plurality of RF switches, each one of said second plurality of RF switches having a second common port and a second pair of branch ports;
    a plurality of RF propagation networks, each one of said RF propagation networks having a first end coupled to another one of said first pair of corresponding branch ports and a second end coupled to one of said second pair of corresponding branch ports; and
    means for providing an RF signal path between each common port of said second plurality of RF switches and an output port of the circuit; and
    wherein each one of the first plurality of RF switches and second plurality of RF switches comprises:
    a first signal path coupled between the common port and the first branch port, thereof; and
    a second signal path coupled between the common port and the second branch port, thereof; and
    wherein the first signal path and the second signal path each comprises:
    a first and a second field effect transistor, each field effect transistor having a conductive state and a non-conductive state to provide a relatively low insertion loss characteristic when in the conductive state and a relatively high insertion loss characteristic when in the non-conductive state, each field effect transistor having a first electrode coupled to the common port of the RF switch and each field effect transistor having a second electrode coupled to the corresponding branch port of the RF switch.

5. The circuit of claim 4 wherein each one of said plurality of RF propagation networks, having a signal fed thereto, is provided having an electrical pathlength in the range of 60 to 120 electrical degrees to the signal with a pre-determined frequency.

6. The circuit of claim 5 wherein each one of said RF terminations comprises:

a resistor having a first electrode coupled to the first end of said corresponding RF termination and a second electrode; and a capacitor having first electrode coupled to the second electrode of the resistor and a second electrode of said capacitor coupled to a second end of the corresponding RF termination.

7. The circuit of claim 6 further comprising a different plurality of field effect transistors, each different field effect transistor having a conductive state and a non-conductive state to provide a relatively low insertion loss characteristic when in the conductive state and a relatively high insertion loss characteristic when in the non-conductive state, each one of the different plurality of field effect transistors having a first electrode coupled to a corresponding signal path and further having a second electrode coupled to an RF ground potential.

8. A circuit comprising:

a plurality of RF oscillators, each one of said plurality of RF oscillators providing a signal having a different frequency;

a first plurality of RF switches, each one of said first plurality of RF switches having a first common port and a first pair of branch ports with each one of said first common ports being coupled to a corresponding one of said plurality of RF oscillators;

a first plurality of resistors, each one of said plurality of resistors having a first electrode, said first electrode coupled to one of said first pair of branch ports of a corresponding one of said first plurality of RF switches, and a second electrode;

a first plurality of capacitors, each one of said plurality of capacitors having a first electrode, said first electrode coupled to the second electrode of a corresponding one of the first plurality resistors, and a second electrode coupled to ground;

a second plurality of RF switches, each one of said second plurality of RF switches having a second common port and a second pair of branch ports;

a plurality of RF propagation networks, each one of said RF propagation networks having a first end coupled to the other one of said first corresponding pair of branch ports and a second end coupled to one of said second corresponding pair of branch ports;

a second plurality of capacitors, each one of said second plurality of capacitors having a first electrode, said first electrode coupled to the other one of said second corresponding pair of branch ports, and a second electrode coupled to ground; and means for providing an RF signal path between each one of said second plurality of common ports and an output port of the circuit.

9. The circuit of claim 8 wherein each one of said plurality of RF propagation networks comprises an electrical pathlength in the range of 60 to 120 electrical degrees for the corresponding signal provided from the RF oscillator coupled thereto.

* * * * *